(12) United States Patent
Peng et al.

(10) Patent No.: US 10,734,580 B2
(45) Date of Patent: Aug. 4, 2020

(54) MEMORY DEVICE AND FABRICATION METHOD THEREOF

(71) Applicant: TAIWAN SEMICONDUCTOR MANUFACTURING CO., LTD., Hsinchu (TW)

(72) Inventors: Tai-Yen Peng, Hsinchu (TW); Hui-Hsien Wei, Taoyuan (TW); Wei-Chih Wen, Hsinchu County (TW); Pin-Ren Dai, New Taipei (TW); Chien-Min Lee, Hsinchu County (TW); Han-Ting Tsai, Kaohsiung (TW); Jyu-Horng Shieh, Hsinchu (TW); Chung-Te Lin, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/397,871

(22) Filed: Apr. 29, 2019

(65) Prior Publication Data

US 2019/0252610 A1 Aug. 15, 2019

Related U.S. Application Data

(63) Continuation of application No. 15/799,416, filed on Oct. 31, 2017, now Pat. No. 10,276,794.

(51) Int. Cl.
| | |
|---|---|
| *H01L 45/00* | (2006.01) |
| *H01L 27/24* | (2006.01) |
| *H01L 43/02* | (2006.01) |
| *H01L 43/12* | (2006.01) |
| *H01L 27/22* | (2006.01) |

(52) U.S. Cl.
CPC .......... *H01L 45/148* (2013.01); *H01L 27/228* (2013.01); *H01L 27/2436* (2013.01); *H01L 27/2472* (2013.01); *H01L 27/2481* (2013.01); *H01L 43/02* (2013.01); *H01L 43/12* (2013.01); *H01L 45/08* (2013.01); *H01L 45/085* (2013.01); *H01L 45/1233* (2013.01); *H01L 45/1266* (2013.01); *H01L 45/146* (2013.01); *H01L 45/1616* (2013.01); *H01L 45/1675* (2013.01)

(58) Field of Classification Search
CPC ............................ G11C 11/16; G11C 13/0069
USPC .................................................. 365/148, 158
See application file for complete search history.

(56) References Cited

U.S. PATENT DOCUMENTS

| | | | |
|---|---|---|---|
| 9,312,482 B2 * | 4/2016 | Tu ......................... | H01L 45/146 |
| 9,502,466 B1 | 11/2016 | Chuang et al. | |
| 9,553,019 B1 | 1/2017 | Briggs et al. | |
| 10,186,308 B1 * | 1/2019 | Guarisco ............. | G11C 11/1675 |

(Continued)

*Primary Examiner* — Michael T Tran
(74) *Attorney, Agent, or Firm* — Maschoff Brennan

(57) ABSTRACT

A memory device includes an inter-layer dielectric (ILD) layer, a metallization pattern, an etch stop layer, a metal-containing compound layer, a memory cell, and a bottom electrode via. The metallization pattern is in the ILD layer. The etch stop layer is over the ILD layer. The metal-containing compound layer is over the etch stop layer. The memory cell is over the metal-containing compound layer and includes a bottom electrode, a resistance switching element over the bottom electrode, and a top electrode over the resistance switching element. The bottom electrode via connects the bottom electrode to the metallization pattern through the metal-containing compound layer and the etch stop layer.

20 Claims, 12 Drawing Sheets

(56) References Cited

U.S. PATENT DOCUMENTS

| | | | |
|---|---|---|---|
| 2006/0063376 A1 | 3/2006 | Lee et al. | |
| 2008/0316794 A1* | 12/2008 | Philipp | H01L 45/06 365/148 |
| 2009/0273086 A1 | 11/2009 | Bartsch et al. | |
| 2011/0001108 A1* | 1/2011 | Greene | H03K 19/17724 257/2 |
| 2012/0018764 A1 | 1/2012 | Choi et al. | |
| 2012/0129301 A1 | 5/2012 | Or-Bach et al. | |
| 2014/0203236 A1 | 7/2014 | Chen et al. | |
| 2014/0264641 A1 | 9/2014 | Frohberg et al. | |
| 2014/0264926 A1* | 9/2014 | Wu | H01L 21/76802 257/774 |
| 2015/0021537 A1* | 1/2015 | Xie | H01L 45/1616 257/2 |
| 2015/0228893 A1* | 8/2015 | Narayanan | H01L 45/1233 257/4 |
| 2015/0249143 A1* | 9/2015 | Sano | H01L 29/66666 257/66 |
| 2015/0255718 A1* | 9/2015 | Liu | H01L 45/146 257/4 |
| 2015/0287795 A1 | 10/2015 | Gaan et al. | |
| 2016/0093566 A1* | 3/2016 | Ting | H01L 23/5226 257/774 |
| 2016/0111517 A1* | 4/2016 | Wu | H01L 29/78642 438/154 |
| 2016/0233333 A1 | 8/2016 | Toh et al. | |
| 2016/0240252 A1* | 8/2016 | Oh | G11C 13/0069 |
| 2016/0322416 A1* | 11/2016 | Nara | H01L 27/14643 |
| 2017/0117467 A1* | 4/2017 | Chang | H01L 45/08 |
| 2017/0200800 A1* | 7/2017 | Liu | H01L 21/31144 |
| 2017/0243923 A1* | 8/2017 | Jeong | H01L 27/2481 |
| 2018/0040817 A1 | 2/2018 | Chuang et al. | |
| 2018/0158728 A1* | 6/2018 | Chu | H01L 43/08 |
| 2018/0166559 A1 | 6/2018 | Zhou et al. | |
| 2018/0315817 A1* | 11/2018 | Van Dal | H01L 29/42392 |
| 2019/0067373 A1* | 2/2019 | Yang | H01L 45/1253 |
| 2019/0148623 A1* | 5/2019 | Liao | H01L 43/12 257/421 |
| 2019/0164619 A1* | 5/2019 | Chung | G06F 30/392 |
| 2019/0165259 A1* | 5/2019 | Liao | H01L 43/10 |
| 2019/0288198 A1* | 9/2019 | Desu | H01L 45/1266 |
| 2020/0013438 A1* | 1/2020 | Hsu | G11C 7/106 |
| 2020/0027505 A1* | 1/2020 | Lee | G11C 13/004 |
| 2020/0051627 A1* | 2/2020 | Hong | G11C 13/004 |
| 2020/0051632 A1* | 2/2020 | Park | G11C 13/003 |
| 2020/0082884 A1* | 3/2020 | Hanyu | G11C 11/1675 |

* cited by examiner

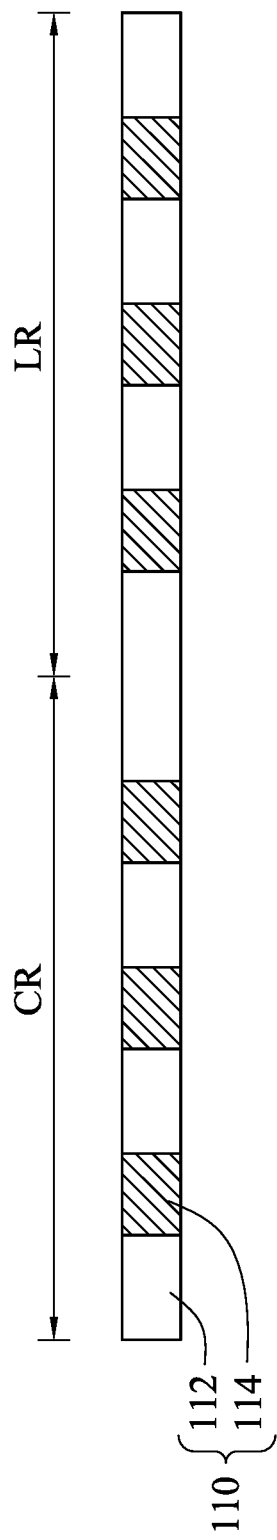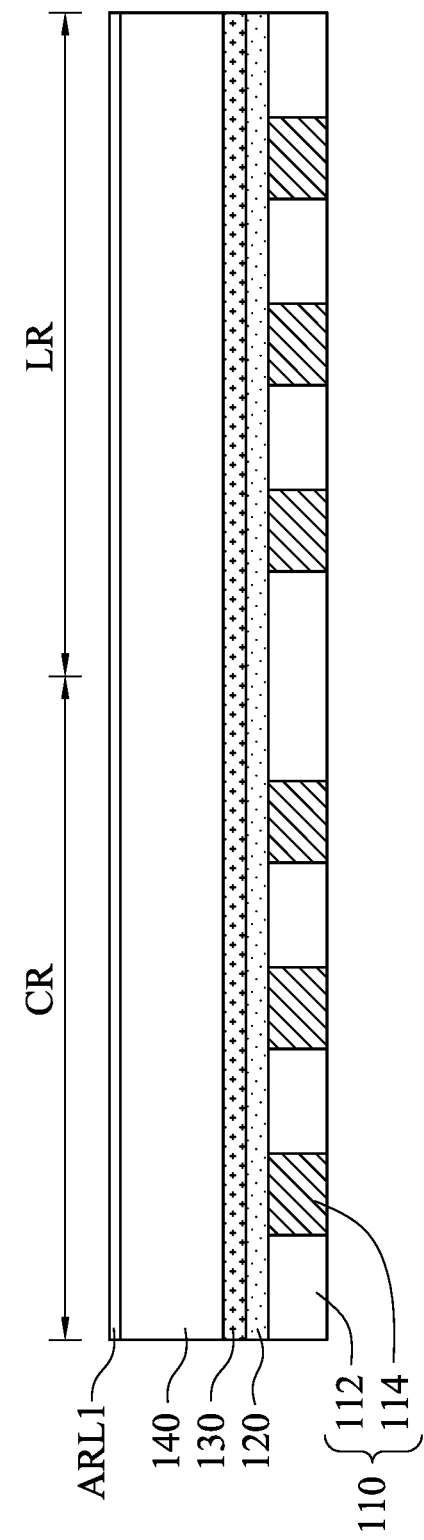

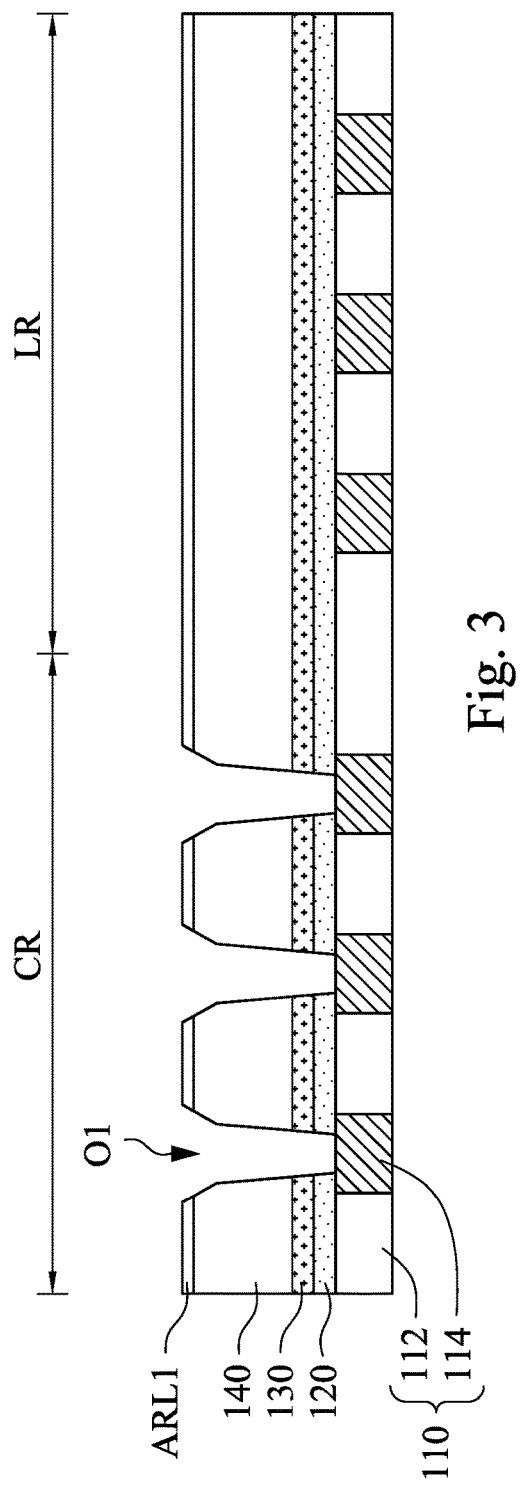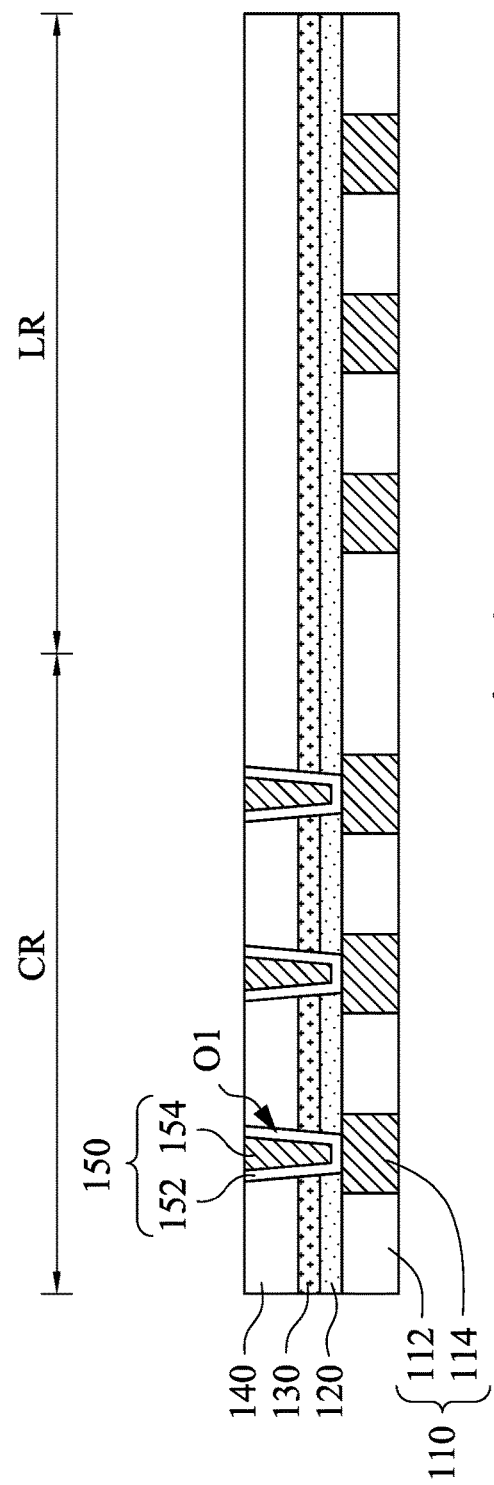

MEMORY DEVICE AND FABRICATION METHOD THEREOF

PRIORITY CLAIM AND CROSS-REFERENCE

This application is a continuation of U.S. patent application Ser. No. 15/799,416, filed Oct. 31, 2017, now U.S. Pat. No. 10,276,794, issued Apr. 30, 2019, which is herein incorporated by reference.

BACKGROUND

Semiconductor memories are used in integrated circuits for electronic applications, including radios, televisions, cell phones, and personal computing devices, as examples. One type of semiconductor memory device involves spin electronics, which combines semiconductor technology and magnetic materials and devices. The spins of electrons, through their magnetic moments, rather than the charge of the electrons, are used to indicate a bit.

One such spin electronic device is magnetoresistive random access memory (MRAM) array, which includes conductive lines (word lines and bit lines) positioned in different directions, e.g., perpendicular to each other in different metal layers. The conductive lines sandwich a magnetic tunnel junction (MTJ), which functions as a magnetic memory cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-13 are cross-sectional views of the MRAM device at various intermediate stages of manufacture according to various embodiments of the present disclosure.

DETAILED DESCRIPTION

Figure 5:
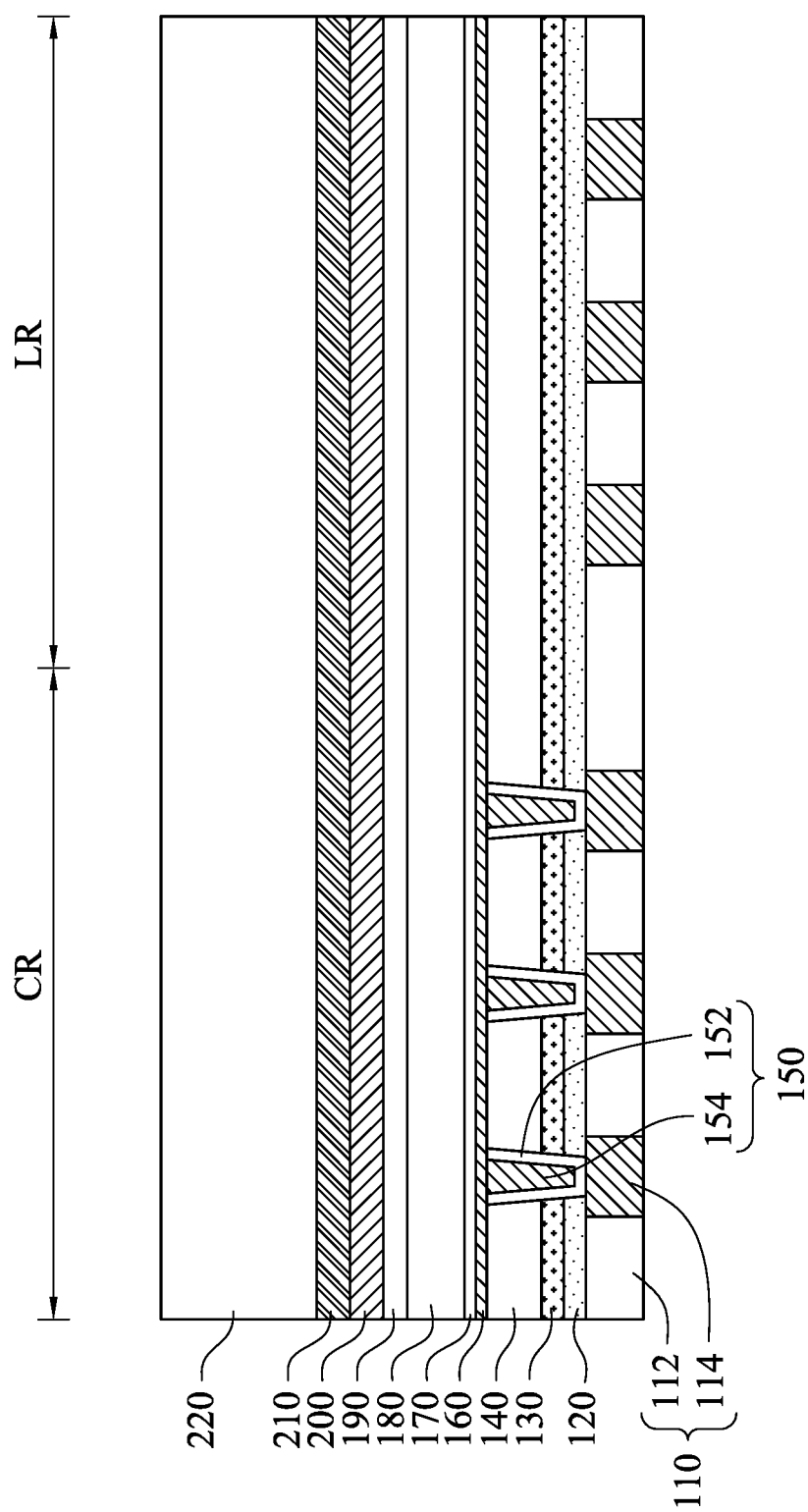

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to some embodiments of this disclosure, a magnetoresistive random access memory (MRAM) device is formed. The MRAM device includes a magnetic tunnel junction (MTJ) stack. The resistance switching element includes a tunnel barrier layer formed between a ferromagnetic pinned layer and a ferromagnetic free layer. The tunnel barrier layer is thin enough (such a few nanometers) to permit electrons to tunnel from one ferromagnetic layer to the other. A resistance of the resistance switching element is adjusted by changing a direction of a magnetic moment of the ferromagnetic free layer with respect to that of the ferromagnetic pinned layer. When the magnetic moment of the ferromagnetic free layer is parallel to that of the ferromagnetic pinned layer, the resistance of the resistance switching element is in a lower resistive state, corresponding to a digital signal "0". When the magnetic moment of the ferromagnetic free layer is anti-parallel to that of the ferromagnetic pinned layer, the resistance of the resistance switching element is in a higher resistive state, corresponding to a digital signal "1". The resistance switching element is coupled between top and bottom electrode and an electric current flowing through the resistance switching element (tunneling through the tunnel barrier layer) from one electrode to the other is detected to determine the resistance and the digital signal state of the resistance switching element.

According to some embodiments of this disclosure, the MRAM device is formed within a chip region of a substrate. A plurality of semiconductor chip regions is marked on the substrate by scribe lines between the chip regions. The substrate will go through a variety of cleaning, layering, patterning, etching and doping steps to form the MRAM devices. The term "substrate" herein generally refers to a bulk substrate on which various layers and device elements are formed. In some embodiments, the bulk substrate includes silicon or a compound semiconductor, such as GaAs, InP, SiGe, or SiC. Examples of the layers include dielectric layers, doped layers, polysilicon layers or conductive layers. Examples of the device elements include transistors, resistors, and/or capacitors, which may be interconnected through an interconnect layer to additional integrated circuits.

FIG. 1 illustrates a wafer having a substrate 110 thereon. The substrate 110 has a logic region LR where logic circuits are to be formed and a memory region CR where memory devices are to be formed. The substrate 110 includes an interlayer dielectric (ILD) layer or inter-metal dielectric (IMD) layer 112 with a metallization pattern 114 over the logic region LR and the memory region CR. The ILD layer 112 may be silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof. The metallization pattern 114 may be aluminum, aluminum alloy, copper, copper alloy, titanium, titanium nitride, tantalum, tantalum nitride, tungsten, cobalt, the like, and/or combinations thereof. Formation of the metallization pattern 114 and the ILD layer 112 may be a dual-damascene process and/or a single-damascene process. The substrate 110 may also include active and passive devices, for example, underlying the ILD layer 112. These further components are omitted from the figures for clarity. In some embodiments, a dielectric layer having a bottom electrode via (BEVA) therein is formed over the substrate, and a bottom electrode (BE) layer is formed over the dielectric layer.

Reference is then made to FIG. 2. An etch stop layer 120, a protective layer 130, and a dielectric layer 140 are formed over the logic region LR and the memory region CR of the substrate 110 in a sequence. The etch stop layer 120 may have a high etch resistance to one or more subsequent etching processes. The etch stop layer 120 may be formed of dielectric material different from the underlying ILD layer 112. For example, the ILD layer 112 may be a silicon oxide layer, and the etch stop layer 120 may be a silicon nitride layer.

The protective layer 130 may be formed of dielectric material different from the etch stop layer 120 and the dielectric layer 140. In some embodiments, the protective layer 130 is an aluminum-based layer (Al-based layer). For example, the protective layer 130 is made from $AlO_x$, AlN, $AlN_yO_x$, other suitable material, or the combination thereof. In some other embodiments, the protective layer 130 may be a metal oxide layer containing other metals. By way of example, the protective layer 130 is a titanium oxide layer. In some embodiments, the protective layer 130 can be a single layer or a multi-layered structure.

The dielectric layer 140 in some embodiments is silicon carbide (SiC), silicon oxynitride (SiON), silicon nitride (SiN), silicon dioxide, TEOS, low-k dielectrics, black diamond, FSG, PSG, BPSG, the like, and/or combinations thereof. The dielectric layer 140 may be a single-layered structure or a multi-layered structure. The dielectric layer 140 may be formed by acceptable deposition techniques, such as chemical vapor deposition (CVD), atomic layer deposition (ALD), physical vapor deposition (PVD), the like, and/or a combination thereof. In some embodiments, an anti-reflection layer ARL1, for example, a nitrogen-free anti-reflection layer (NFARL) is optionally formed over the dielectric layer 140.

Reference is then made to FIG. 3. Openings O1 are formed in the anti-reflection layer ARL1, the etch stop layer 120, the protective layer 130, and the dielectric layer 140 in the memory region CR, and exposes portions of the metallization pattern 114. An exemplary formation method of the openings O1 includes forming a patterned mask may over the anti-reflection layer ARL1, and then etching the anti-reflection layer ARL1, the etch stop layer 120, the protective layer 130, and the dielectric layer 140 through the patterned mask by one or more etching processes, such as dry etching, wet etching, or combinations thereof.

Reference is then made to FIG. 4. Bottom electrode vias (BEVA) 150 are then formed within the openings O1. In some embodiments, at least one of the BEVAs 150 is a multi-layered structure and includes, for example, a diffusion barrier layer 152 and a filling metal 154 filling a recess in the diffusion barrier layer 152. An exemplary formation method of the BEVAs 150 includes forming in sequence the diffusion barrier layer and the filling metal 154 into the openings O1, and performing a planarization process, such as a chemical-mechanical polish (CMP) process, to remove excess materials of the filling metal 154 and of the diffusion barrier layer 152 outside the openings O1. The remaining diffusion barrier layer 152 and the remaining filling metal 154 in the openings O1 can serve as the BEVAs 150. In some embodiments, the BEVAs 150 are electrically connected to an underlying electrical component, such as a transistor, through the metallization pattern 114.

In some embodiments, the diffusion barrier layer 152 is a titanium nitride (TiN) layer or a tantalum nitride (TaN) layer, which can act as a suitable barrier to prevent metal diffusion. Formation of the diffusion barrier layer 152 may be exemplarily performed using CVD, PVD, ALD, the like, and/or a combination thereof. In some embodiments, the filling metal 154 is titanium (Ti), tantalum (Ta), platinum (Pt), ruthenium (Ru), tungsten (W), aluminum (Al), copper (Cu), the like, and/or combinations thereof. Formation of the filling metal 154 may be exemplarily performed using CVD, PVD, ALD, the like, and/or a combination thereof.

Reference is made to FIG. 5. A blanket bottom electrode layer 160 is then formed over the BEVAs 150 and over the dielectric layer 140, so that the bottom electrode layer 160 extends along top surfaces of the BEVAs 150 and of the dielectric layer 140. The bottom electrode layer 160 can be a single-layered structure or a multi-layered structure. The bottom electrode layer 160 includes a material the same as the filling metal 154 in some embodiments. In some other embodiments, the bottom electrode layer 160 includes a material different from the filling metal 154. In some embodiments, the bottom electrode layer 160 is titanium (Ti), tantalum (Ta), platinum (Pt), ruthenium (Ru), tungsten (W), aluminum (Al), copper (Cu), TiN, TaN, the like, and/or a combination thereof. Formation of the bottom electrode layer 160 may be exemplarily performed using CVD, PVD, ALD, the like, and/or a combination thereof.

In some embodiments, a buffer layer 170 is formed over the bottom electrode layer 160. The buffer layer 170 may include a non-magnetic material. For example, the buffer layer 170 may include tantalum, aluminum, titanium, TiN, or TaN. The buffer layer 170 may be deposited by PVD. Alternatively, the buffer layer is deposited by an electroless plating process or other suitable process. In some embodiment, the buffer layer 170 may be performed by an extra CMP process for providing a flattened surface.

A resistance switching layer 180 is formed over the bottom electrode layer 160 and the buffer layer 170. In some embodiments, the resistance switching layer 180 may be a magnetic tunnel junction (MTJ) structure. To be specific, the resistance switching layer 180 includes at least a first magnetic layer, a tunnel barrier layer and a second magnetic layer are formed in sequence over the bottom electrode layer 160 and the buffer layer 170. The magnetic moment of the second magnetic layer may be programmed causing the resistance of the resulting MTJ cell to be changed between a high resistance and a low resistance.

In some embodiments, the first magnetic layer includes an anti-ferromagnetic material (AFM) layer over the buffer layer 170 and a ferromagnetic pinned layer over the AFM layer. In the anti-ferromagnetic material (AFM) layer, magnetic moments of atoms (or molecules) align in a regular pattern with magnetic moments of neighboring atoms (or molecules) in opposite directions. A net magnetic moment of the AFM layer is zero. In certain embodiments, the AFM layer includes platinum manganese (PtMn). In some embodiments, the AFM layer includes iridium manganese (IrMn), rhodium manganese (RhMn), iron manganese (FeMn), or OsMn. An exemplary formation method of the AFM layer includes sputtering, PVD, ALD or the like.

The ferromagnetic pinned layer in the first magnetic layer forms a permanent magnet and exhibits strong interactions with magnets. A direction of a magnetic moment of the ferromagnetic pinned layer can be pinned by an anti-ferromagnetic material (AFM) layer and is not changed during operation of a resulting resistance switching element fabricated from the resistance switching layer 180. In certain embodiments, the ferromagnetic pinned layer includes cobalt-iron-boron (CoFeB). In some embodiments, the ferromagnetic pinned layer includes CoFeTa, NiFe, Co, CoFe, CoPt, or the alloy of Ni, Co and Fe. An exemplary formation method of the ferromagnetic pinned layer includes sputtering, PVD, ALD, thermal or e-beam evaporated deposition. In some embodiments, the ferromagnetic pinned layer includes a multilayer structure.

The tunnel barrier layer is formed over the first magnetic layer. The tunnel barrier layer can also be referred to as a tunneling layer, which is thin enough that electrons are able to tunnel through the tunnel barrier layer when a biasing voltage is applied to a resulting resistance switching element fabricated from the resistance switching layer 180. In certain embodiments, the tunnel barrier layer includes magnesium oxide (MgO), aluminum oxide ($Al_2O_3$), aluminum nitride (AlN), aluminum oxynitride (AlON), hafnium oxide ($HfO_2$) or zirconium oxide ($ZrO_2$). An exemplary formation method of the tunnel barrier layer 172 includes sputtering, PVD, ALD, e-beam or thermal evaporated deposition, or the like.

The second magnetic layer is formed over the tunnel barrier layer. The second magnetic layer is a ferromagnetic free layer in some embodiments. A direction of a magnetic moment of the second magnetic layer is not pinned because there is no anti-ferromagnetic material in the second magnetic layer. Therefore, the magnetic orientation of this layer is adjustable, thus the layer is referred to as a free layer. In some embodiments, the direction of the magnetic moment of the second magnetic layer is free to rotate parallel or anti-parallel to the pinned direction of the magnetic moment of the ferromagnetic pinned layer in the first magnetic layer. The second magnetic layer may include a ferromagnetic material similar to the material in the ferromagnetic pinned layer in the first magnetic layer. Since the second magnetic layer has no anti-ferromagnetic material while the first magnetic layer has an anti-ferromagnetic material therein, the first and second magnetic layers and have different materials. In certain embodiments, the second magnetic layer includes cobalt, nickel, iron or boron, compound or alloy thereof. An exemplary formation method of the second magnetic layer includes sputtering, PVD, ALD, e-beam or thermal evaporated deposition, or the like.

In some embodiments where resistive random access memory (RRAM) cells are to be formed on the wafer, the resistance switching layer 180 may include a RRAM dielectric layer such as metal oxide composite, such as hafnium oxide ($HfO_x$), zirconium oxide ($ZrO_x$), aluminum oxide ($AlO_x$), nickel oxide ($NiO_x$), tantalum oxide ($TaO_x$), or titanium oxide ($TiO_x$) as in its relative high resistance state and a metal such as titanium (Ti), hafnium (Hf), platinum (Pt), ruthenium (Ru), and/or aluminum (Al) as in its relative low resistance state.

Capping layers 190 and 200 are formed over the resistance switching layer 180. The capping layers 190 and 200 may include a thin metal-oxide or metal-nitride layer. The metal in the metal-oxide (or metal-nitride) capping layer includes beryllium (Be), magnesium (Mg), aluminium (Al), titanium (Ti), tungsten (W), germanium (Ge), platinum (Pt), Ruthenium (Ru) and their alloy. In some embodiments, the thickness of the capping layer 190 is in a range from about 3 angstroms to about 20 angstroms. The capping layers 190 and 200 may be deposited by PVD with introducing an oxygen gas during the metal deposition to form a metal-oxide capping layers 190 and 200.

A top electrode layer 210 is formed over the capping layer 200. The top electrode layer 210 includes a conductive material. In some embodiments, the top electrode layer 210 is similar to the bottom electrode layer 160 in terms of composition. In some embodiments, the top electrode layer 210 comprises titanium (Ti), tantalum (Ta), platinum (Pt), ruthenium (Ru), tungsten (W), aluminum (Al), copper (Cu), the like or combinations thereof. An exemplary formation method of the top electrode layer 210 includes sputtering, PVD, ALD or the like.

A hard mask layer 220 is formed over the top electrode layer 210 in sequence. In some embodiments, the hard mask layer 220 is formed from a dielectric material. For example, the hard mask layer 220 may be silicon carbide (SiC), silicon oxynitride (SiON), silicon nitride (SiN), silicon dioxide ($SiO_2$), amorphous carbon, (i.e., ARD), the like, and/or combinations thereof. In some embodiments, the hard mask layer 220 may be formed from a conductive material. The hard mask layer 220 may be formed by acceptable deposition techniques, such as CVD, ALD, PVD, the like, and/or combinations thereof.

Figure 6:
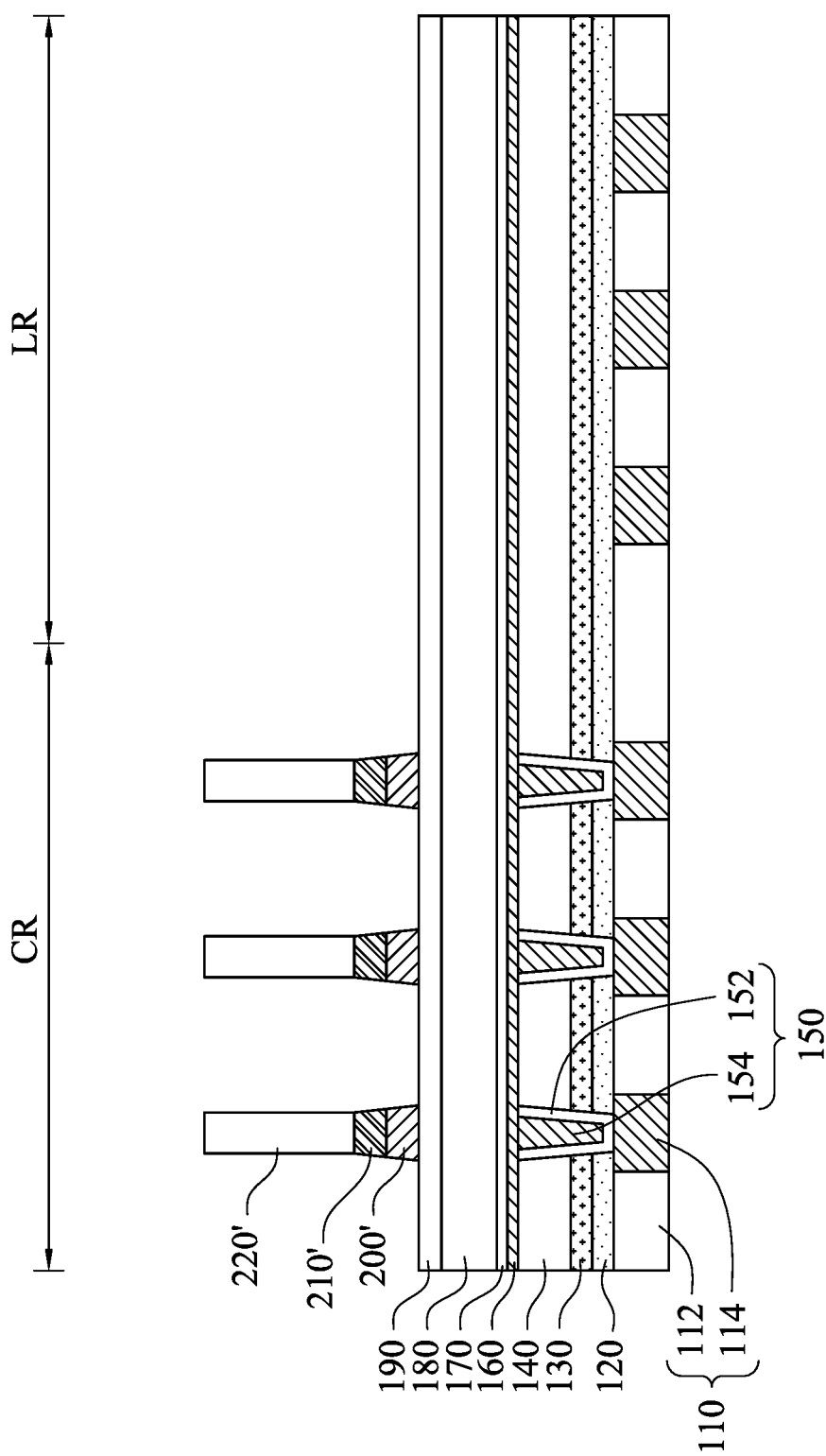

Reference is made to FIG. 6. A resist layer is formed over the hard mask layer 220 and then patterned into a patterned resist mask using a suitable photolithography process, such that portions of the hard mask layer 220 are exposed by the patterned resist mask. In some embodiments, the patterned resist mask is a photoresist. In some embodiments, the patterned resist mask is an ashing removable dielectric (ARD), which is a photoresist-like material generally having generally the properties of a photoresist and amendable to etching and patterning like a photoresist. An exemplary photolithography process may include photoresist coating (e.g., spin-on coating), soft baking, mask aligning, exposure, post-exposure baking, developing the photoresist, rinsing, drying (e.g., hard baking), other suitable processes, or combinations thereof.

An etching process is performed to remove portions of the hard mask layer 220, underlying top electrode layer 210, and the underlying capping layer 200 not protected by the patterned resist mask. The hard mask layer 220, underlying top electrode layer 210, and the underlying capping layer 200 may be etched using acceptable etching techniques, such as by using an anisotropic etching process. In some embodiments, the capping layer 190 may has a higher etch resistance to the etching process than that of the capping layer 200. After the removal, capping layers 200', top electrodes 210', and hard mask covers 220' remains as shown in FIG. 6. The patterned resist mask is removed using, for example, an ash process, after the etching process.

Figure 7:
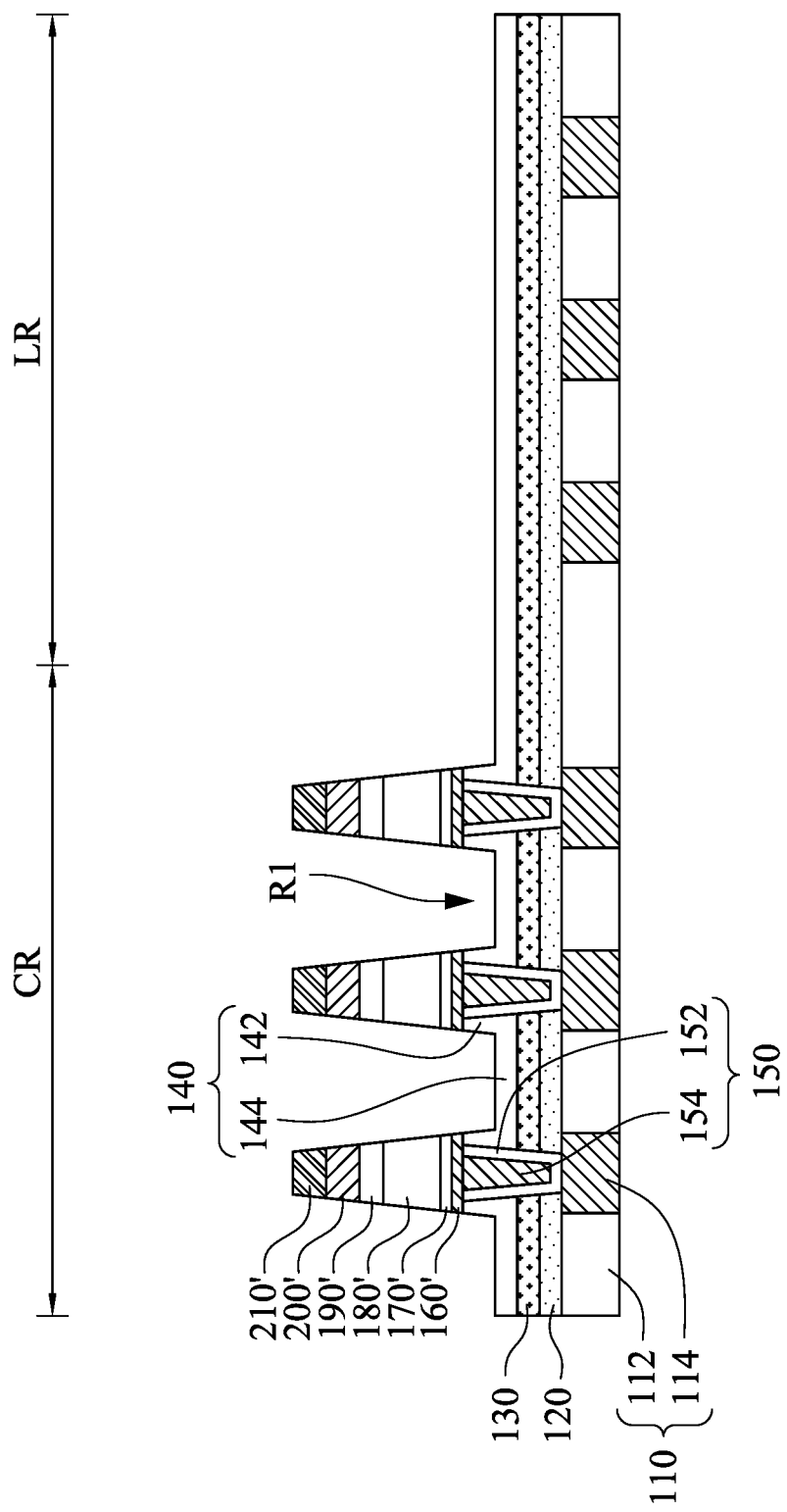

Reference is then made to FIG. 7. An etching process is performed to remove exposed portions of the capping layer 190, underlying resistance switching layer 180, underlying buffer layer 170, and underlying bottom electrode layer 160 not protected by the hard mask covers 220' and the top electrodes 210'. The capping layer 190, the resistance switching layer 180, the underlying buffer layer 170, and the underlying bottom electrode layer 160 may be etched using acceptable etching techniques, such as by using an anisotropic etching process. After the etching process, capping layers 190', resistance switching elements 180', underlying buffers 170', and underlying bottom electrodes 160' remain as shown in FIG. 7. The hard mask covers 220' are removed after the etching process.

In some embodiments, portions of the dielectric layer 140 not protected by the hard mask covers 220' and the top electrodes 210' are also etched, and recesses R1 are formed in the remaining dielectric layer 140'. The remaining dielectric layer 140' includes portions 142 and portions 144. The portions 142 are thicker than the portion 144s. The portions 142 surround the BEVAs 150 respectively. In some embodiments, a top end of the portions 142 is leveled up with the top surface of the BEVAs 150.

Figure 8:
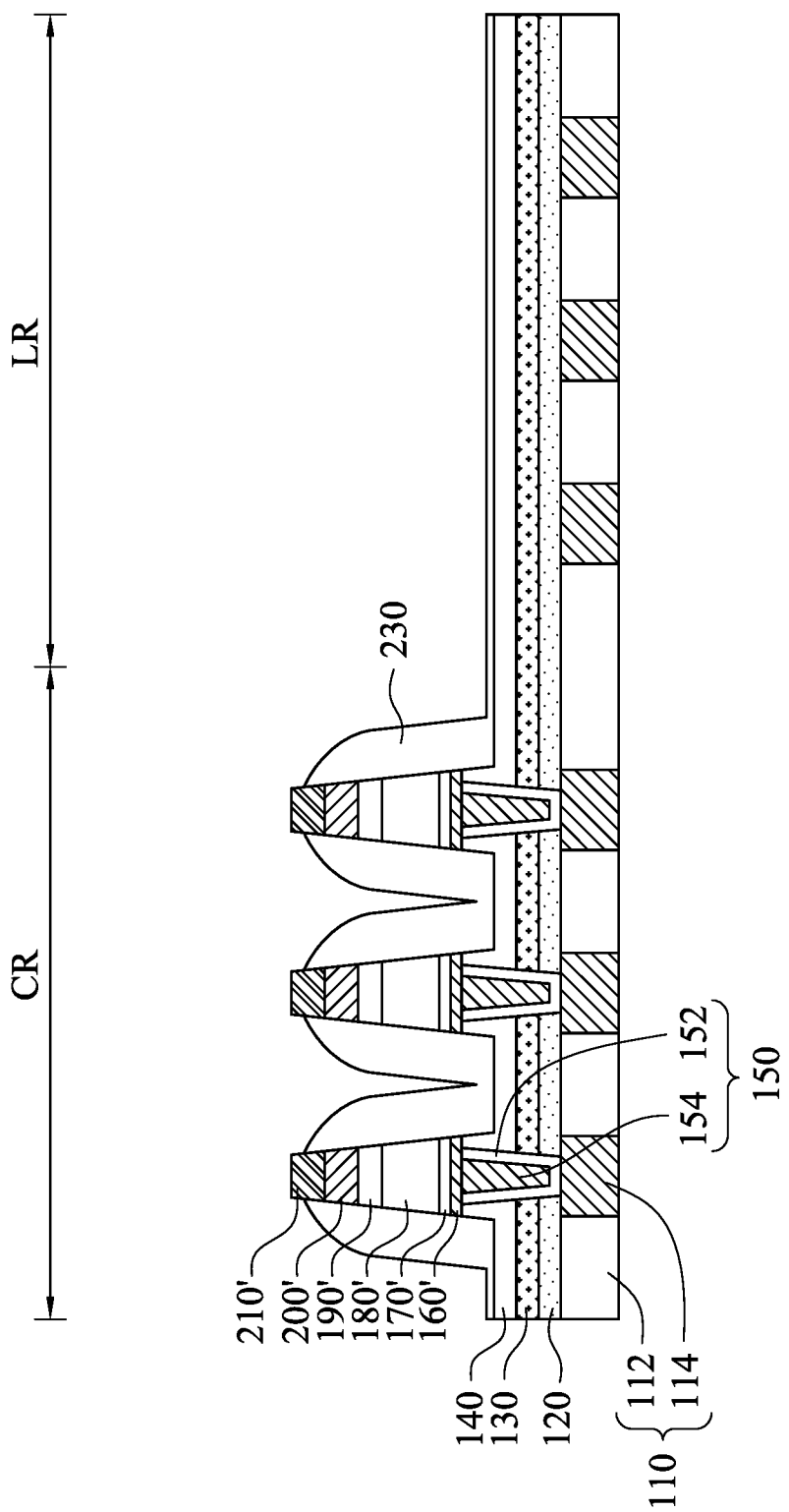

Reference is then made to FIG. 8. At least one spacer 230 is formed along a sidewall of the resistance switching elements 180'. The spacer 230 may include multiple layers. The spacer 230 in some embodiments may include SiN, but in other embodiments may include SiC, SiON, silicon oxycarbide (SiOC), the like, and/or combinations thereof. An exemplary formation method of the spacer 230 includes forming a spacer layer over the resistance switching elements 180' and the top electrodes 210' and etching the spacer layer into the spacer 230. The spacer layer may be formed using CVD, PVD, ALD, the like, and/or combinations thereof. After the etching process, a portion of the top electrodes 210' is exposed by the spacer 230. In some embodiments, the spacer 230 is formed around and encloses the resistance switching elements 180'.

In some embodiments, the etching process to the spacer layer may be stopped before reaching the dielectric layer 140, and therefore a thin film of the spacer 230 leaves over a top surface of the dielectric layer 140. For example, the spacer 230 has a thin film over the top surface of the dielectric layer 140 in the logic region LR. In some other embodiments, the dielectric layer 140 may have a higher etch resistance to the etching process than that of the spacer 230, such that the etching process to the spacer layer may stop at the top surface of the dielectric layer 140, and leaves no thin film of the spacer 230 over the top surface of the dielectric layer 140.

Figure 9:
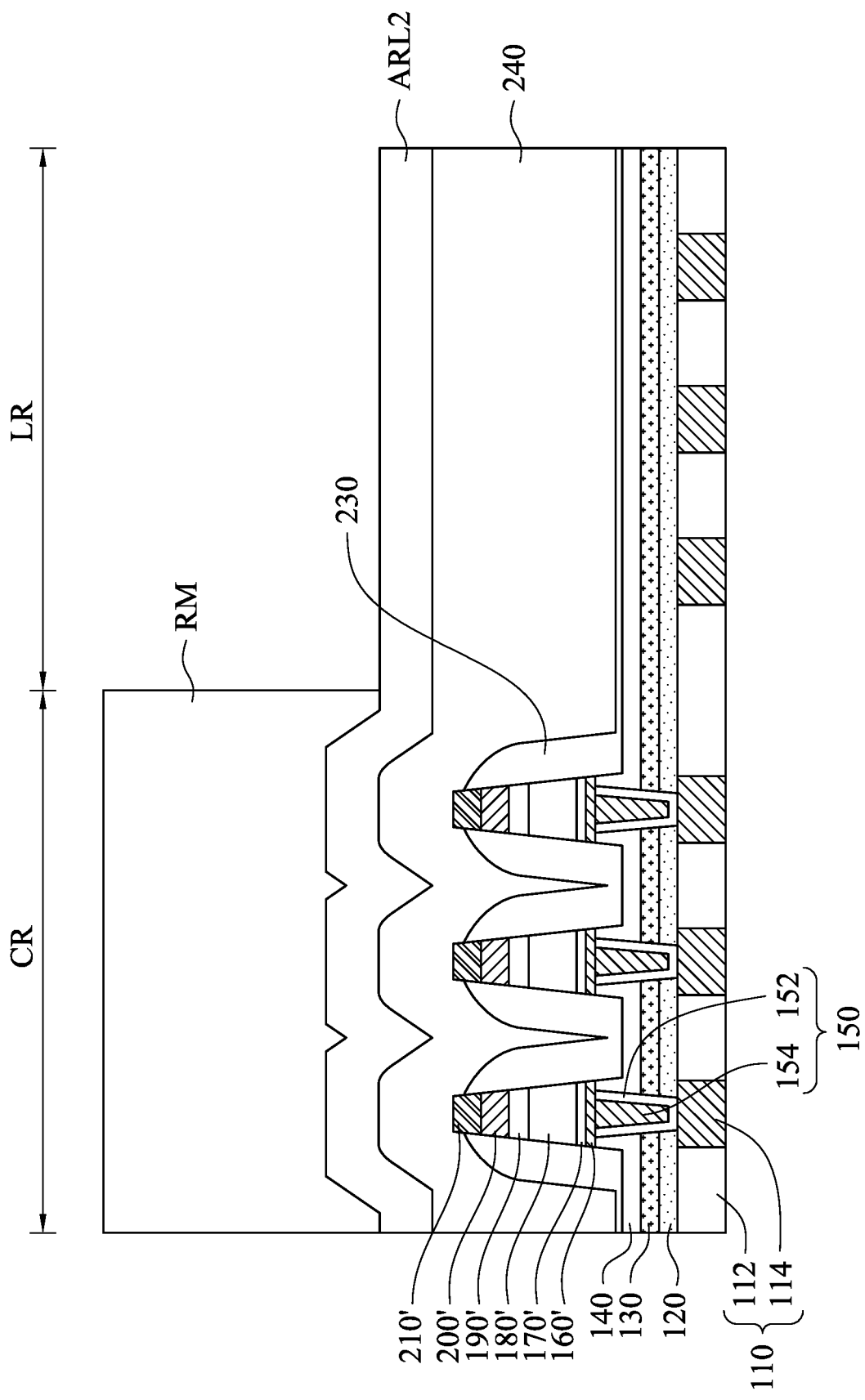

Referring back to FIG. 9. Another ILD layer 240 is formed over the substrate 110. In some embodiments, the ILD layer 240 may have the same material as the ILD layer 112. In some other embodiments, the ILD layer 240 may have a different material than the ILD layer 112. In some embodiments, the ILD layer 240 includes silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof. An anti-reflection layer ARL2, for example, a nitrogen-free anti-reflection layer (NFARL) is optionally formed over the ILD layer 240.

Herein, a resist mask RM is formed over the ILD layer 240 and the anti-reflection layer ARL2. The resist mask RM is forming by patterning a resist layer (e.g., a photoresist layer) using a suitable photolithography process. The resist mask RM covers the memory region CR and exposes the logic region LR.

Figure 10:
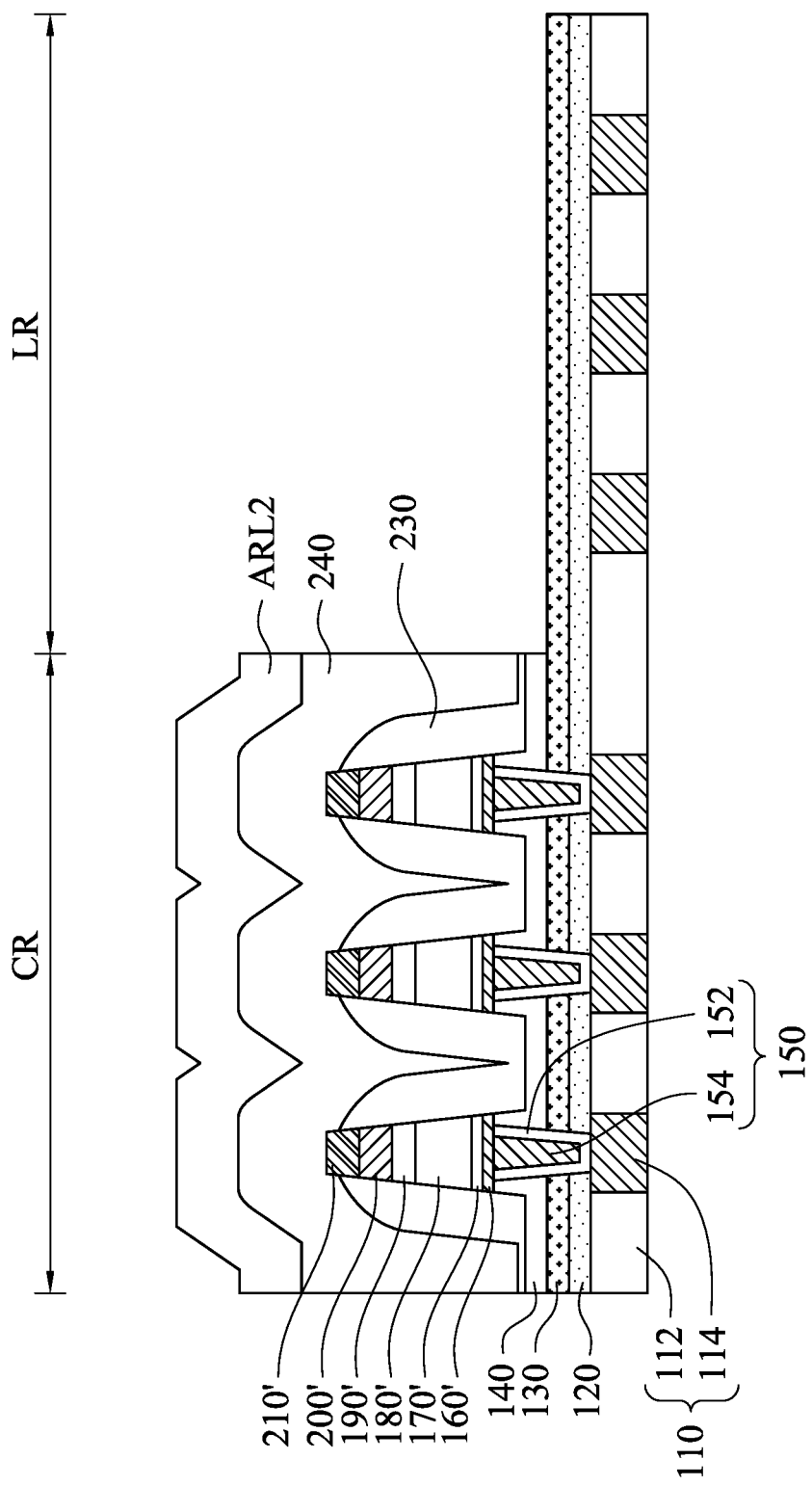

Reference is made to FIG. 10. Portions of the anti-reflection layer ARL2, the ILD layer 240, and the dielectric layer 140 in the logic region LR are removed. The removal may be performed by an etching process. In some embodiments where the ILD layer 240 is silicon oxide, the etchant used in etching the ILD layer 240 can be dilute hydrofluoric acid (HF), HF vapor, $CF_4$, $C4F_8$, $CH_xF_y$, $C_xF_y$, $SF_6$, or $NF_3$ gas. The resist mask RM acts as an etching mask during the etching process, and the elements in the memory region CR are protected from being etched by the resist layer RM. After the etching process, the anti-reflection layer ARL2, the ILD layer 240, and the dielectric layer 140 are not in the logic region LR.

In some embodiments, the etchant used in etching process can be dilute hydrofluoric acid (HF), HF vapor, $CF_4$, $C4F_8$, $CH_xF_y$, $C_xF_y$, $SF_6$, or $NF_3$ gas. In some embodiments, the protective layer 130 may has a higher etch resistance to the etching process than that of the ILD layer 240 and the dielectric layer 140. For example, in an etching process using dilute HF, HF vapor, $CF_4$, $C_4F_8$, $CH_xF_y$, $C_xF_y$, $SF_6$, or $NF_3$ gas as an etchant, an etch rate of the protective layer 130 is slower than that of at least one of the ILD layer 240 and the dielectric layer 140. Through the configuration, the etching process in the logic region LR stops at the protective layer 130, and the etch stop layer 120 is protected by the protective layer 130 during the etching process. In some embodiments, the protective layer 130 may have a higher etch resistance to the etching process than that of the etch stop layer 120.

Figure 11:
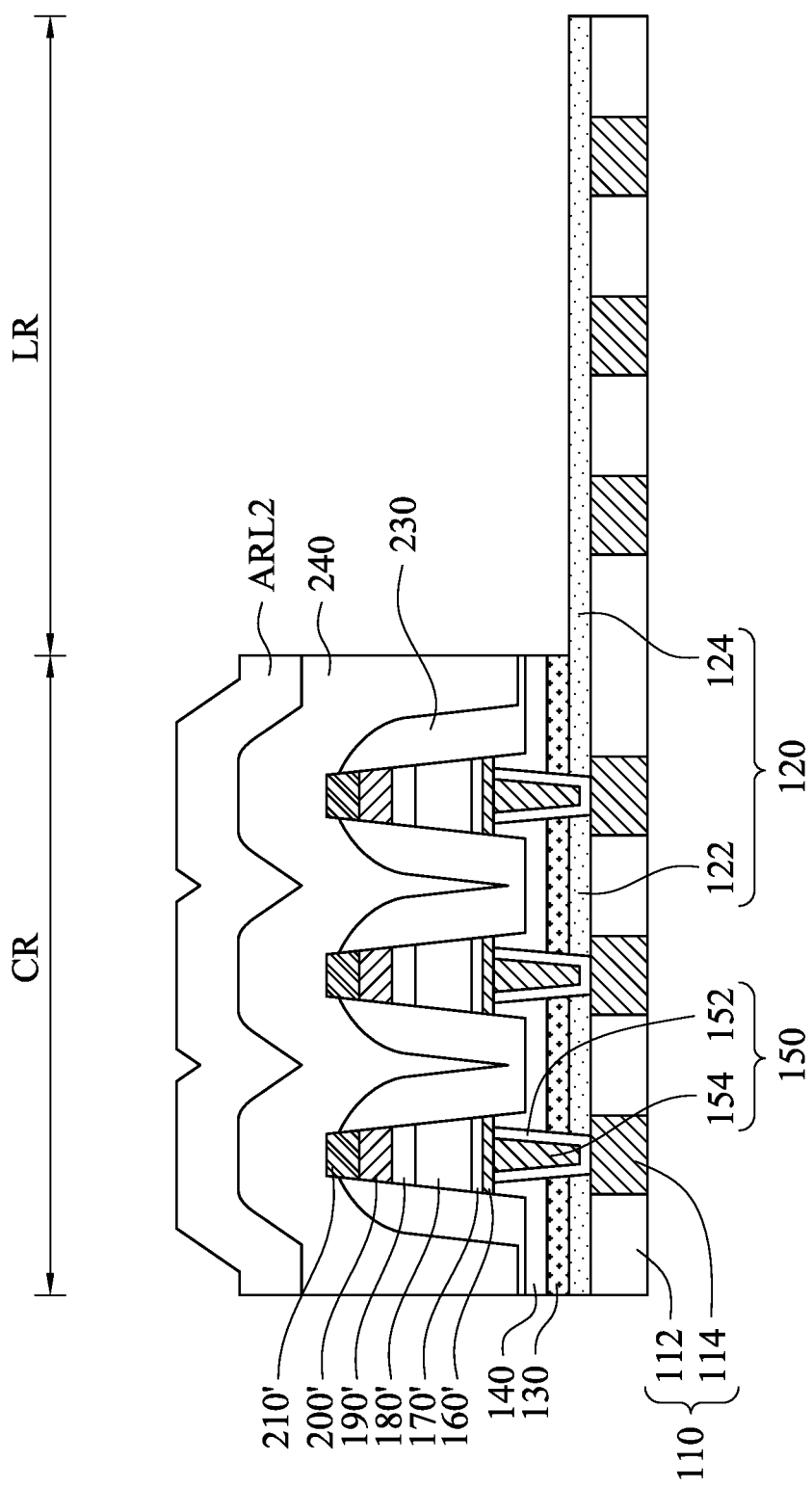

Reference is made to FIG. 11. A portion of the protective layer 130 in the logic region LR is removed. The removal may be performed by dry etching, atomic layer etching (ALE), wet etching, or the combination thereof. The etch stop layer 120 has a higher etch resistance to the etching process than that of the protective layer 130, such that the etching process stops at the etch stop layer 120. After the removal, the protective layer 130 is not in the logic region LR. For example, the protective layer 130 extends along a top surface of the first portion 122 of the etch stop layer 120 and terminating prior to reaching a top surface of the second portion 124 of the etch stop layer 120.

Herein, the etch stop layer 120 has a first portion 122 in the memory region CR and a second portion 124 in the logic region LR, and after the removal, the protective layer 130 covers the first portion 122 of the etch stop layer 120 and exposes the second portion 124 of the etch stop layer 120.

Figure 12:
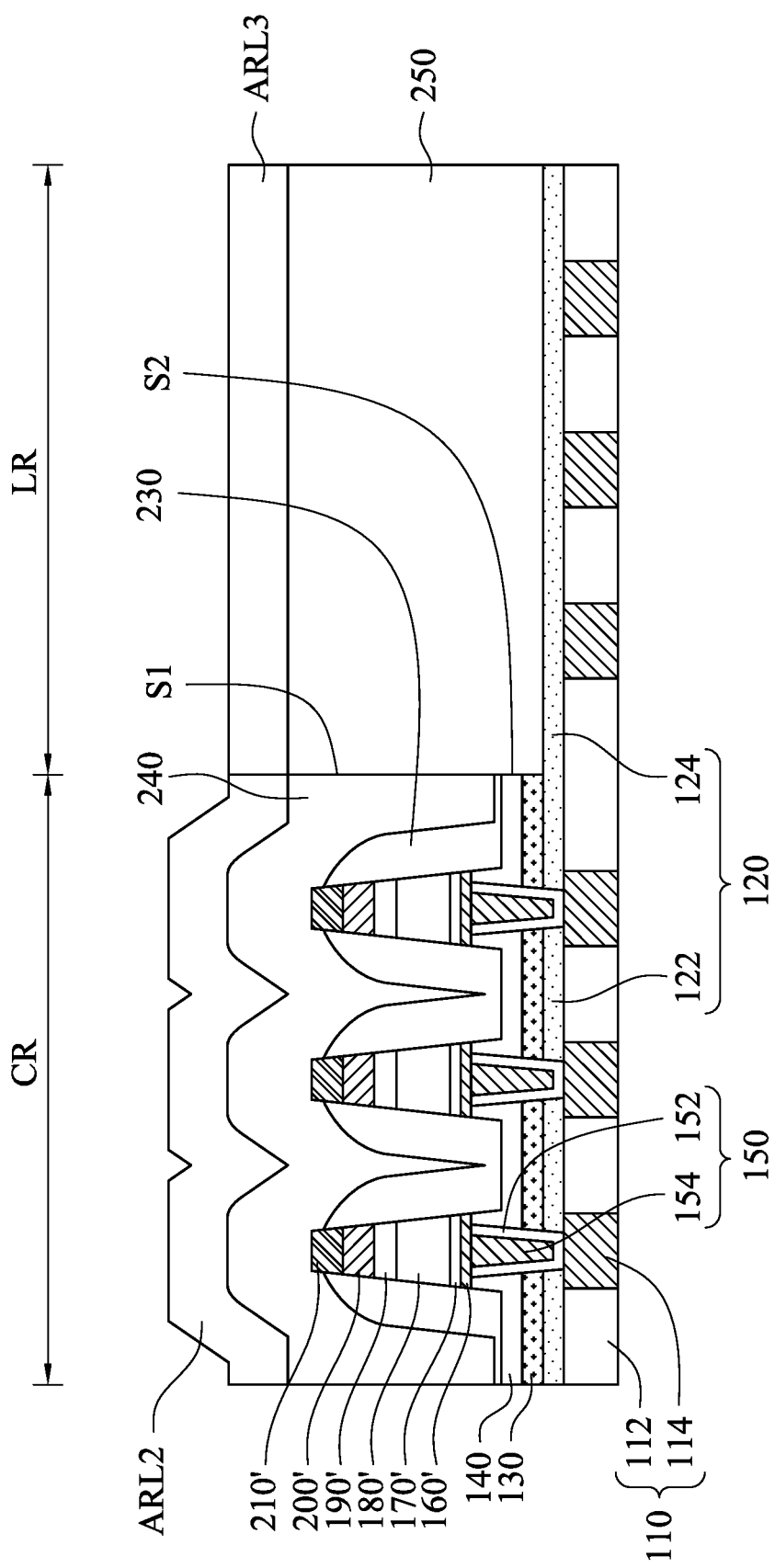

Reference is made to FIG. 12. Another ILD layer 250 is formed over the substrate 110. Since the ILD layers 240 and 250 are formed at different operations, there is a clear interface S1 between the ILD layers 240 and 250. Also, since the ILD layer 250 and the dielectric layer 140 are formed at different operations, there is a clear interface S2 between the ILD layer 250 and the dielectric layer 140.

In some embodiments, the ILD layer 250 may have the same material as the ILD layer 240 or the dielectric layer 140. In some other embodiments, the ILD layer 250 may have a different material than the ILD layer 240 or the dielectric layer 140. In some embodiments, the ILD layer 250 includes silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof. An anti-reflection layer ARL2, for example, a nitrogen-free anti-reflection layer (NFARL) is optionally formed over the ILD layer 250.

Figure 13:
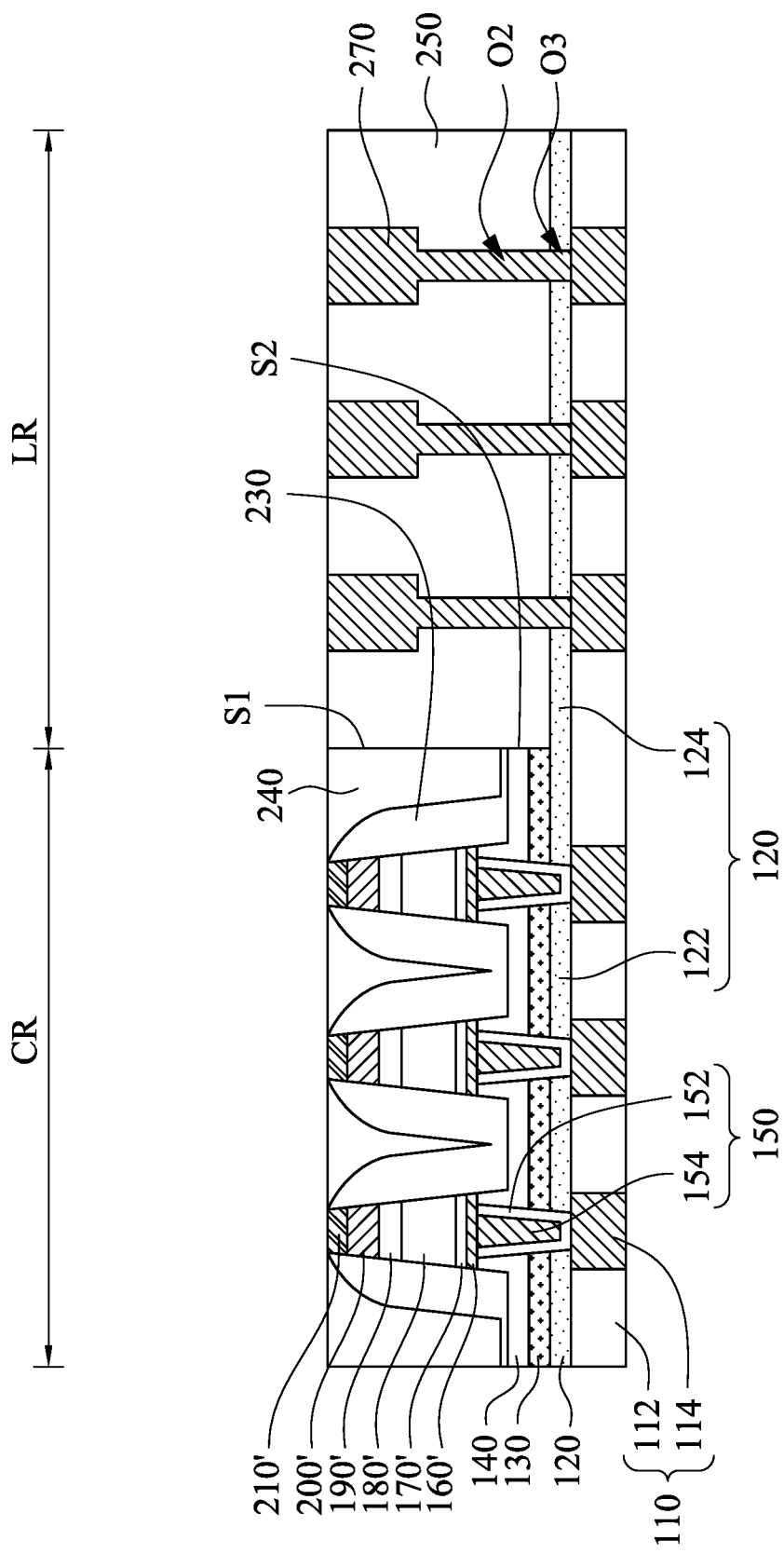

Reference is made to FIG. 13. A metallization pattern 270 is then formed in the ILD layer 250. Formation of the metallization pattern 270 may be formed by etching openings O2 in the ILD layer 250, etching openings O3 in the second portion 124 of the etch stop layer 120, and then filling one or more metals (e.g., copper) in the openings O2 and O3 to form the metallization pattern 270. In some embodiments where the ILD layer 250 is silicon oxide, the etchant used in etching the openings O2 can be dilute hydrofluoric acid (HF), HF vapor, $CF_4$, $C4F_8$, $CH_xF_y$, $C_xF_y$, $SF_6$, or $NF_3$ gas.

In some embodiments, the etch stop layer 120 may has a higher etch resistance to the etching the openings O2 than that of the ILD layer 250. For example, in an etching process using dilute HF, HF vapor, $CF_4$, $C_4F_8$, $CH_xF_y$, $C_xF_y$, $SF_6$, or $NF_3$ gas as an etchant, an etch rate of the etch stop layer 120 is slower than that of at least one of the ILD layer 250. Since the etch stop layer 120 is protected by the protective layer 130 during previous etching process (e.g., the etching process to the ILD layer 240 and the dielectric layer 140), the thickness of the etch stop layer 120 is maintained, and therefore the etching the openings O2 may stop at the etch stop layer 120 and not damage the underlying ILD layer 112. After the openings O2 and O3 are filled with metals, a planarization is performed to remove an excess portion of the metals outside the openings O2, and therefore the metallization pattern 270 is formed. Through the configuration, the metallization pattern 270 can reach and electrically connect the metallization pattern 114.

In some embodiments of the present disclosure, a top surface of the first portion 122 of the etch stop layer 120 is in contact with the protective layer 130, and a top surface of the second portion 124 of the etch stop layer 120 is in contact with the ILD layer 250. The protective layer is in the memory region CR and not in the logic region LR. The protective layer 130 can be detect by material detection technology or material analysis technology. For example, energy dispersive X-ray (EDX) spectroscopy, Auger electron spectroscopy (AES), secondary-ion mass spectrometry (SIMS), or other suitable techniques may be adopted for detecting the aluminum in the device, and thereby ensuring the existence of the protective layer 130.

Figure 14:
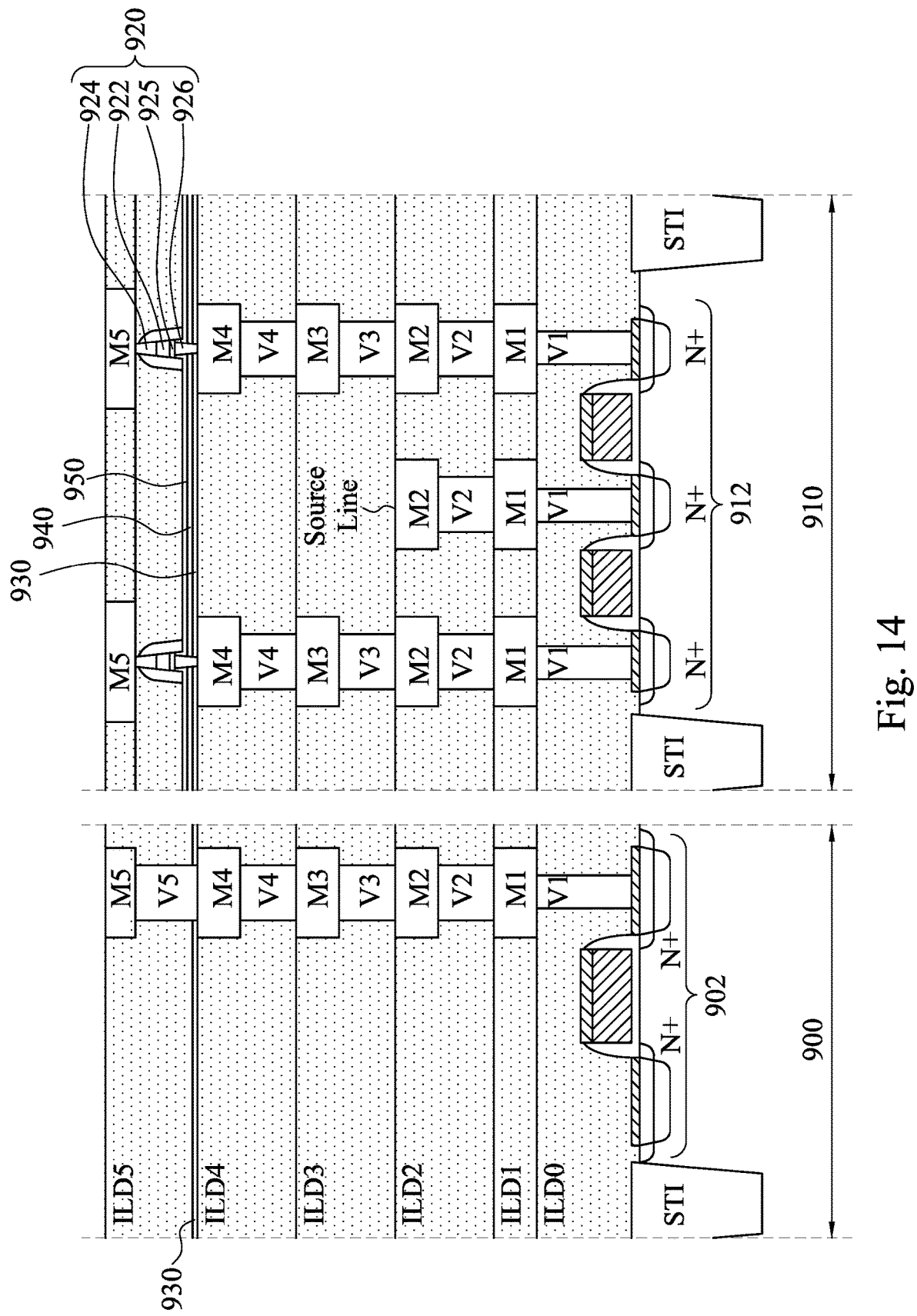
FIG. 14 illustrates an integrated circuit including MRAM devices and logic devices.

FIG. 14 illustrates an integrated circuit including MRAM devices and logic devices. The integrated circuit includes a logic region 900 and a MRAM region 910. Logic region 900 may include circuitry, such as the exemplary transistor 902, for processing information received from MRAM devices 920 in the MRAM region 910 and for controlling reading and writing functions of MRAM devices 920. In some embodiments, the MRAM device 920 includes an resistance switching element 922, a top electrode 924 over the resistance switching element 922, and a bottom electrode 925 under the resistance switching element 922, and a BEVA 926 under the bottom electrode 925 and in a etch stop layer 930, a protective layer 940, and a dielectric layer 950. The etch stop layer 930 extends across the logic region 900 and the MRAM region 910. The protective layer 940 is in the MRAM region 910 and not in the logic region 900. The dielectric layer 950 is in the MRAM region 910 and not in the logic region 900.

As depicted, the integrated circuit is fabricated using five metallization layers, labeled as M1 through M5, with five layers of metallization vias or interconnects, labeled as V1 through V5. Other embodiments may contain more or fewer metallization layers and a corresponding more or fewer number of vias. Logic region 900 includes a full metallization stack, including a portion of each of metallization layers M1-M5 connected by interconnects V2-V5, with V1 connecting the stack to a source/drain contact of logic transistor 902. The MRAM region 910 includes a full metallization stack connecting MRAM devices 920 to transistors 912 in the MRAM region 910, and a partial metallization stack connecting a source line to transistors 912 in the MRAM region 910. MRAM devices 920 are depicted as being fabricated in between the top of the M4 layer and the bottom the M5 layer. In some embodiments, MRAM devices 920 may be with the same height of M5+V5, and thus the M5 layer is absent from the MRAM region 910. Also included in integrated circuit is a plurality of ILD layers. Six ILD layers, identified as ILD0 through ILD5 are depicted in FIG. 14 as spanning the logic region 900 and the MRAM region 910. The ILD layers may provide electrical insulation as well as structural support for the various features of the integrated circuit during many fabrication process steps.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the protective layer may protect the etch stop layer during the removal of the dielectric layers in the logic region, such that the thickness of the etch stop layer is not reduced. Another advantage is that the etch stop layer, the thickness of which is not reduced, may protect the underlying ILD layer from being damaged during the formation of circuits in the logic region, such that the circuits in the logic region is kept from punch issues.

In some embodiments, a memory device includes an inter-layer dielectric (ILD) layer, a metallization pattern, an etch stop layer, a metal-containing compound layer, a memory cell, and a bottom electrode via. The metallization pattern is in the ILD layer. The etch stop layer is over the ILD layer. The metal-containing compound layer is over the etch stop layer. The memory cell is over the metal-containing compound layer and includes a bottom electrode, a resistance switching element over the bottom electrode, and a top electrode over the resistance switching element. The bottom electrode via connects the bottom electrode to the metallization pattern through the metal-containing compound layer and the etch stop layer.

In some embodiments, a memory device includes a memory region and a logic region adjacent to the memory region, a first inter-layer dielectric (ILD) layer, a metallization pattern, a metal-containing compound layer, and a memory cell. The metallization pattern is in the first ILD layer. The metal-containing compound layer is over the first ILD layer and within the memory region, in which the logic region is free of the metal-containing compound layer. The memory cell is over the metal-containing compound layer, within the memory region, and including a bottom electrode, a resistance switching element over the bottom electrode and a top electrode over the resistance switching element.

In some embodiments, a method for fabricating a memory device includes depositing a metal-containing compound layer over a first inter-layer dielectric (ILD) layer, wherein the metal-containing compound layer has a first portion within a memory region and a second portion within a logic region; depositing a memory dielectric layer over the metal-containing compound layer, wherein the memory dielectric layer has a first portion within the memory region and a second portion within the logic region; depositing a bottom electrode layer, a resistance switching layer, and a top electrode layer over the memory dielectric layer; etching the bottom electrode layer, the resistance switching layer, and the top electrode layer to form a memory cell within the memory region; and etching the second portion of the memory dielectric layer to expose the second portion of the metal-containing compound layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
an inter-layer dielectric (ILD) layer;
a metallization pattern in the ILD layer;
an etch stop layer over the ILD layer;
a metal-containing compound layer over the etch stop layer;
a memory cell over the metal-containing compound layer and comprising a bottom electrode, a resistance switching element over the bottom electrode, and a top electrode over the resistance switching element; and
a bottom electrode via connecting the bottom electrode to the metallization pattern through the metal-containing compound layer and the etch stop layer.

2. The memory device of claim 1, wherein a top surface of the bottom electrode via is higher than a top surface of the metal-containing compound layer.

3. The memory device of claim 1, further comprising:
a memory dielectric layer has a first portion extending along a top surface of the metal-containing compound layer and a second portion extending upwardly along sidewalls of the bottom electrode via.

4. The memory device of claim 3, wherein a top surface of the bottom electrode via is substantially coplanar with a top surface of the second portion of the memory dielectric layer.

5. The memory device of claim 3, wherein the bottom electrode is in contact with a top surface of the second portion of the memory dielectric layer.

6. The memory device of claim 3, further comprising:
a spacer extending along sidewalls of the memory cell, wherein a bottom surface of the spacer is in contact with a top surface of the first portion of the memory dielectric layer.

7. The memory device of claim 1, wherein the metal-containing compound layer comprises an aluminum-based dielectric material.

8. The memory device of claim 1, wherein the metal-containing compound layer is in contact with the etch stop layer.

9. A memory device, comprising:
a memory region and a logic region adjacent to the memory region;
a first inter-layer dielectric (ILD) layer;
a metallization pattern in the first ILD layer;
a metal-containing compound layer over the first ILD layer and within the memory region, wherein the logic region is free of the metal-containing compound layer; and
a memory cell over the metal-containing compound layer, within the memory region, and comprising a bottom electrode, a resistance switching element over the bottom electrode and a top electrode over the resistance switching element.

10. The memory device of claim 9, further comprising:
a bottom electrode via connecting the bottom electrode to the metallization pattern, wherein the bottom electrode via is surrounded by the metal-containing compound layer.

11. The memory device of claim 10, further comprising:
a memory dielectric layer within the memory region and over the metal-containing compound layer, wherein the bottom electrode via is surrounded by the memory dielectric layer.

12. The memory device of claim 11, wherein the logic region is free of the memory dielectric layer.

13. The memory device of claim 9, further comprising:
an etch stop layer over the first ILD layer and comprising a first portion within the memory region and a second portion within the logic region.

14. The memory device of claim 13, wherein the first portion of the etch stop layer is between the metal-containing compound layer and the first ILD layer.

15. The memory device of claim 13, further comprising:
a second ILD layer over and in contact with the second portion of the etch stop layer.

16. A semiconductor device, comprising:
an inter-layer dielectric (ILD) layer;
a conductive feature in the ILD layer;
a bottom electrode via connected to the conductive feature;
a memory cell over the bottom electrode via, wherein the memory cell comprises a bottom electrode, a resistance switching element over the bottom electrode, and a top electrode over the resistance switching element;
a metal-containing compound layer surrounding the bottom electrode via; and
a memory dielectric layer interposed between the bottom electrode of the memory cell and the metal-containing compound layer.

17. The semiconductor device of claim 16, further comprising:
a dielectric layer interposed between the conductive feature and the metal-containing compound layer.

18. The semiconductor device of claim 17, wherein the dielectric layer extends beyond a bottom surface of the metal-containing compound layer.

19. The semiconductor device of claim 16, further comprising:
a spacer on a sidewall of the memory cell and a sidewall of the memory dielectric layer.

20. The semiconductor device of claim 16, wherein the memory cell is directly above the bottom electrode via.

* * * * *